United States Patent [19]
Hsu et al.

[11] Patent Number: 5,521,105
[45] Date of Patent: May 28, 1996

[54] METHOD OF FORMING COUNTER-DOPED ISLAND IN POWER MOSFET

[75] Inventors: Ching-Hsiang Hsu; D. C. Kuo, both of Hsin-Chu, Taiwan

[73] Assignee: United Microelectronics Corporation, Hsinchu, Taiwan

[21] Appl. No.: 289,649

[22] Filed: Aug. 12, 1994

[51] Int. Cl.$^6$ .................................. H01L 21/265
[52] U.S. Cl. ................................ 437/41; 437/45
[58] Field of Search ............. 437/41, 45, 41 CS, 437/41 DM; 257/339, 342, 341, 403, 404, 409

[56] References Cited

U.S. PATENT DOCUMENTS

| | | | |
|---|---|---|---|
| 4,300,150 | 11/1981 | Colak | 257/339 |
| 4,717,679 | 1/1988 | Baliga et al. | 437/29 |
| 4,777,521 | 10/1988 | Coe | 257/339 |
| 4,990,982 | 2/1991 | Omoto et al. | 257/409 |
| 5,019,522 | 5/1991 | Meyer et al. | 437/29 |
| 5,258,636 | 11/1993 | Rumennik et al. | 257/341 |
| 5,311,051 | 5/1994 | Tukizi | 257/339 |
| 5,378,912 | 1/1995 | Pein | 257/339 |

Primary Examiner—George Fourson
Assistant Examiner—Brian K. Dutton
Attorney, Agent, or Firm—George O. Saile; Graham S. Jones, II

[57] ABSTRACT

A metal oxide semiconductor field effect transistor with a lightly doped silicon substrate includes an oppositely doped well and oppositely doped source region and oppositely doped drain region with respect to the lightly doped substrate, the improvement comprising at least one counter doped region formed along the surface of the oppositely doped well between the source and drain regions. The substrate comprises a P-substrate, the well comprises an N-well and the counter doped region is doped P; the counter-doped region comprises an island among a plurality of islands between the source region and the drain region. The counterdoped region comprises an island among a plurality of islands between the source region and the drain region.

8 Claims, 6 Drawing Sheets

METHOD OF FORMING COUNTER-DOPED ISLAND IN POWER MOSFET

BACKGROUND OF THE INVENTION

1. Field of the Invention

This invention relates to power MOSFET devices and more particularly to an improved design of such devices.

2. Description of Related Art

In current power MOSFET devices, in order to reduce the surface breakdown voltage, inclusion in the device of a thin diffused layer is required. The thin diffused layer results in the increase of "ON-resistance" because the width of the conduction path is reduced by this thin diffused layer. "ON-resistance", as employed here, refers to the resistance of the device when it is turned on. The breakdown occurs at a surface which requires less electrical field than the bulk of the semiconductor. The breakdown leads to a lowered dynamic resistance and higher currents. For high voltage device designs, the surface breakdown condition should be avoided.

U.S. Pat. No. 5,019,522 of Meyer et al shows a power transistor and methods for making that transistor.

SUMMARY OF THE INVENTION

In accordance with this invention, a metal oxide semiconductor field effect transistor device with a lightly doped silicon substrate includes an oppositely doped well and oppositely doped source region and oppositely drain region with respect to the lightly doped substrate, manufactured by the method comprising implanting at least one counter doped region formed along the surface of the well between the source and drain regions.

Preferably, the substrate comprises a P-substrate, the well comprises an N- well and the counter doped region is doped P; the counterdoped region comprises an island among a plurality of islands between the source region and the drain region.

BRIEF DESCRIPTION OF THE DRAWINGS

The foregoing and other aspects and advantages of this invention are explained and described below with reference to the accompanying drawings, in which:

FIGS. 2A–2G show a series of steps in the process of manufacture of a device in accordance with this invention.

FIGS. 3A–3G show a series of steps in accordance with the method of this invention of manufacturing of a peripheral device.

DESCRIPTION OF THE PREFERRED EMBODIMENT

This invention provides a counter-doped island or stripe between the source and the drain of a MOSFET device to reduce the surface high field while maintaining a thicker diffused layer which reduces the "ON resistance." Counter-doping refers to using a P dopant in an N-well. Alternatively, it could refer to using an N dopant in a P-well, if that were the embodiment being employed. The dimensions of the stripe depend upon the sustained voltage range. The voltage is up to 800 V with a current of 1 Ampere to 2 Amperes, fully integrated.

Figure 1:
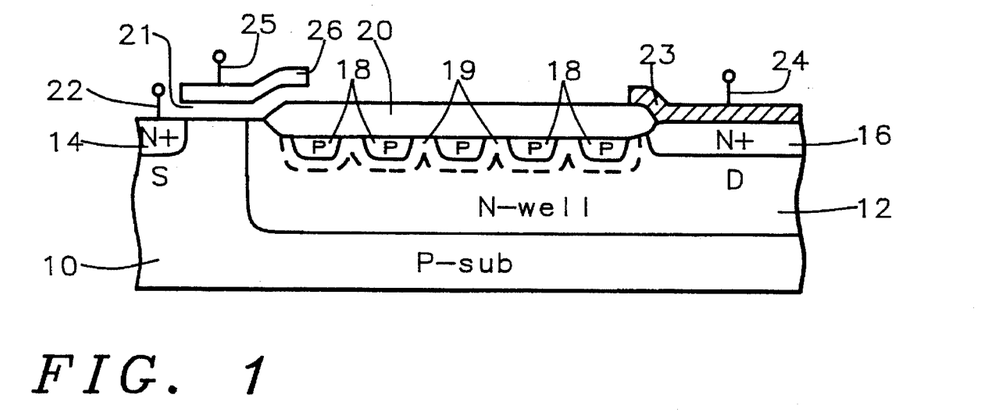
FIG. 1 shows a device with a P doped silicon substrate containing N+ source and drain regions, the substrate also including an N-well with a number of P islands formed along the surface of the N-well between the source region and the drain region, the P islands have been formed along with the N+ region, and the islands are not connected to any electrodes and are at floating potentials.

Referring to FIG. 1, a P doped silicon substrate 10 contains N+ source and drain regions. The substrate 10 also includes an N-well 12 in which a number of P islands 18 were formed along the surface of the N-well between the source region and the drain region. P islands 18 have been formed along with the N+ region 16. The islands 18 are not connected to any electrodes and are at floating potentials. Preferably, the islands 18 are of variable diameters at a depth of 3,000 Å. The depth is within a range from about 3,000 Å to about 5,000 Å.

Formation of islands 18 was performed by implanting dopant composed of $BF_2$ ions into regions where islands 18 were formed. The dopant was applied at a preferred dose of 1E12 $cm^{-2}$ of $BF_2$ at a preferred energy of 40 keV to provide a far higher level of doping than in the remainder of the N-well 12. A range of energies from about 30 keV to about 50 keV is possible. A range of doses from about 1E12 $cm^{-2}$ to about 1E13 $cm^{-2}$ is possible.

The regions 19 are marked off by dotted lines because of the depletion between the N-well and P- islands.

Above the islands 18 and regions 19, a FOX region 20 is formed.

The N+ doped source region 14 is located to the left of the N-well 12 in the P-sub 10. Bridging the source region 14 and the N-well 12 above a gate oxide dielectric 21 is an electrode 26 connected to terminal 25. Source region 14 is connected to electrode 22. Above the N+ drain region 16 to the right of the islands 18 is a polysilicon electrode 23 (formed on the surface of region 16 and FOX region 20) connected to terminal 24. When a high voltage is applied to the drain terminal 24, a large degree of depletion will be formed among the islands 18 and the N-well 12.

The depletion between the counter-doped islands 18 and the N-well can perform the functions as follows:

i) reduce the surface electrical field, ii) result in full depletion in the diffused layer.

Therefore, the breakdown voltage can be increased.

Process of Manufacture of Power MOSFET with Counter-Doped Islands

Implant N-well and drive in of Implanted N-well Ions

Figure 2A:
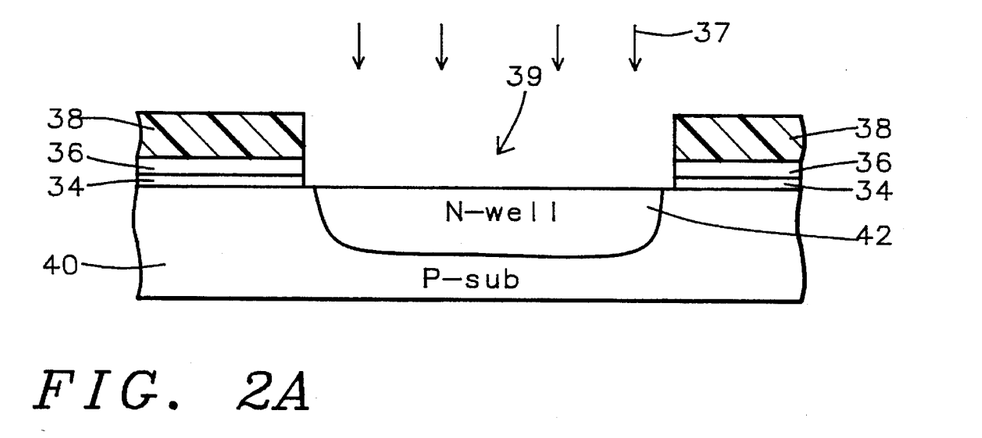
FIG. 2A shows a P doped silicon substrate covered with a thin film gate oxide layer, a silicon nitride ($Si_3N_4$) layer and a photoresist layer for formation of an N-well.

Referring to FIG. 2A, a P doped silicon substrate 40 has been covered with a thin film gate oxide layer 34, a silicon nitride ($Si_3N_4$) layer 36 and a photoresist layer 38. The photoresist layer 38 was photolithographically exposed, patterned and developed and the $Si_3N_4$ layer 36 and the photoresist layer 38 have been etched to form opening 39. Dopant 37 composed of phosphorus ions are implanted through the opening 39 to form N-well 42. The dopant 37 is applied at a preferred dose of 5E10 $cm^{-2}$ of phosphorus at a preferred energy of 250 keV to provide a far higher level of doping than in the remainder of P-sub 40. A range of energies from about 250 keV to about 300 keV is possible. A range of doses from about 1E10 $cm^{-2}$ to about 5E10 $cm^{-2}$ is possible.

Photoresist layer 38, silicon nitride ($Si_3N_4$) layer 36, and thin film gate oxide layer 34 are removed after formation of N-well 42.

P-island implant into N-well

Figure 2B:
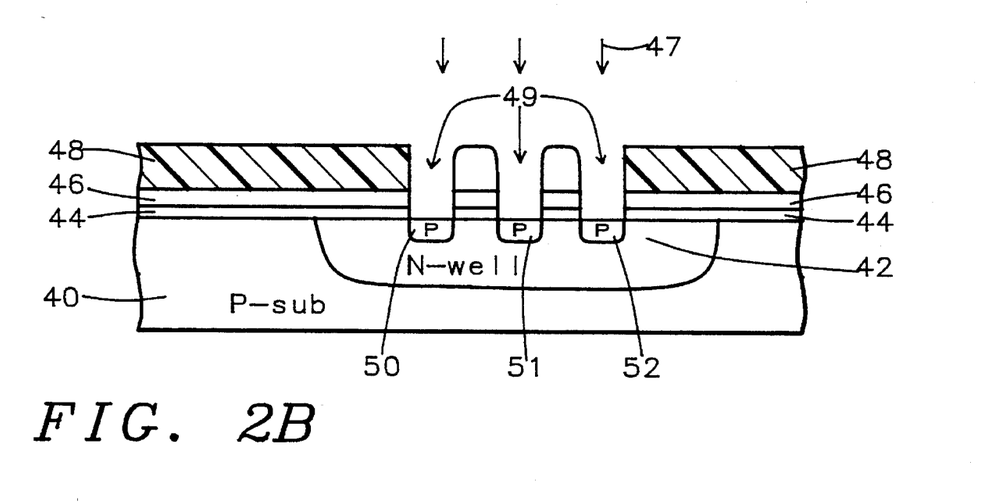
FIG. 2B shows the device of FIG. 2A after a thin film gate oxide layer, a silicon nitride layer and a photoresist layer have been formed for the formation of islands in the N-well.

Referring to FIG. 2B, a thin film gate oxide layer 44, a silicon nitride ($Si_3N_4$) layer 46 and a photoresist layer 48 have been formed. The photoresist layer 48 was photolithographically exposed, patterned and developed and the $Si_3N_4$ layer 46 and the photoresist layer 48 have been etched through layers 46 and 44 to form a plurality of openings 49 down to the top surface of the N-well 42. Then, a number of counter-doped P islands 50, 51 and 52 have been formed spaced apart in the N-well 42 extending to the top surface of the N-well 42.

Preferably, the islands 50, 51 and 52 are of 3,000 Å depth. The depth is within a range from about 3,000 Å to about 5,000 Å.

To form the islands, dopant composed of $BF_2$ ions 47 are implanted through the openings 49 into islands 50, 51 and 52. The dopant is applied at a preferred dose of 1E12 $cm^{-2}$ of $BF_2$ at a preferred energy of 40 keV to provide a counter level of doping to the remainder of N-well 42. A range of energies from about 30 keV to about 50 keV is possible. A range of doses from about 1E12 $cm^{-2}$ to about 1E13 $cm^{-2}$ is possible.

Grow Field Oxide and Drive in P- Island.

Figure 2C:
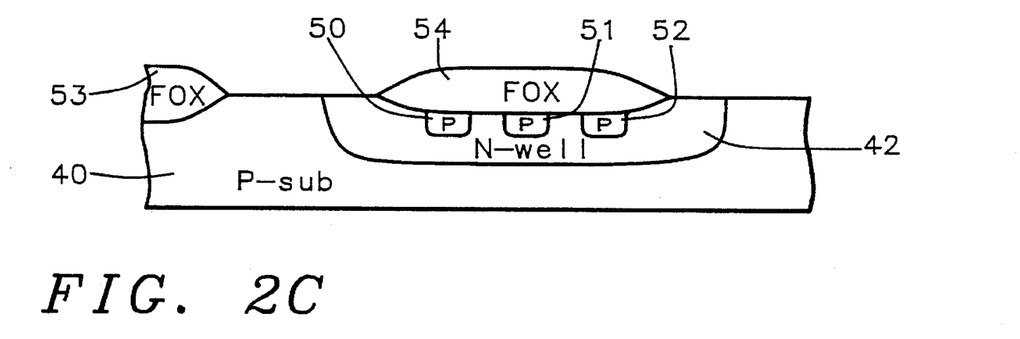
FIG. 2C shows the device of FIG. 2B after FOX regions are formed over the P islands.

Referring to FIG. 2C, FOX regions 53 and 54 are formed by a conventional field oxide process. FOX regions 53 and 54 are formed over the P islands. Wet oxidation is employed to form a field oxide (FOX) 54 layer of silicon dioxide 6,000 Å thick. Field implant is done at the same time as the P-island implant by heating to about 950° C.

FOX regions 53 are formed on the P-substrate 40 on the left and right sides of N-well 42. FOX region 54 is centered over the N-well region 42.

Grow Gate Oxide and Deposit Polysilicon

Figure 2D:
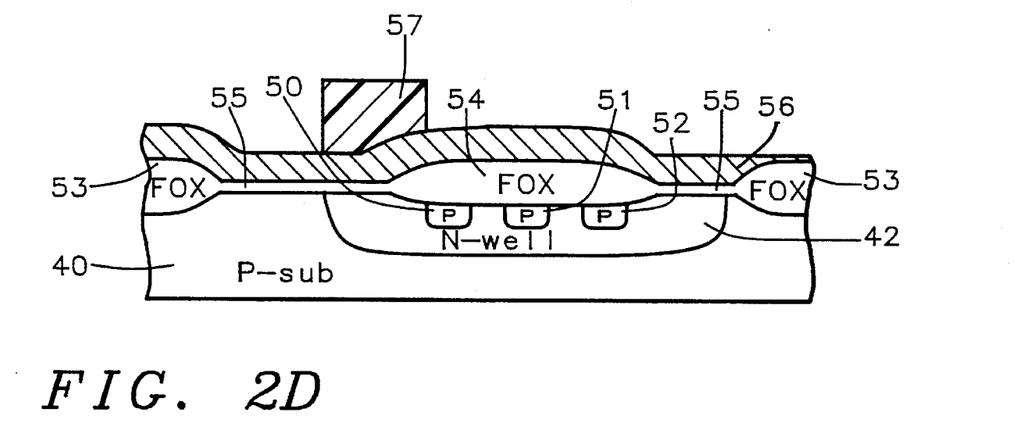
FIG. 2D shows the device of FIG. 2C after a new gate oxide layer is formed on top of the P-sub and the N-well and a FOX region, and a polysilicon layer deposited upon the gate oxide layer, upon which is deposited a photoresist mask for patterning the polysilicon gate which gate is formed by etching using the mask to protect the gate, and the portions of the gate oxide layer not covered by the gate are etched away.

FIG. 2D shows a new gate oxide layer 55 formed on top of the P-sub 40 and the N-well 42 and the FOX region 54. Polysilicon layer 56 is deposited upon the gate oxide layer 55.

Pattern Polysilicon Gate

Upon polysilicon layer 56 is deposited a photoresist mask 57 for patterning the polysilicon gate 56. The gate 56 is formed by etching using the mask 57 to protect the gate 56. In addition, the portions of the gate oxide layer 55 not covered by the gate 56 are etched away. The gate 56 extends from the left of N-well 42 and the FOX region 54 which overlies the N-well 42.

Perform Source/Drain Self-Aligned Implant

Figure 2E:
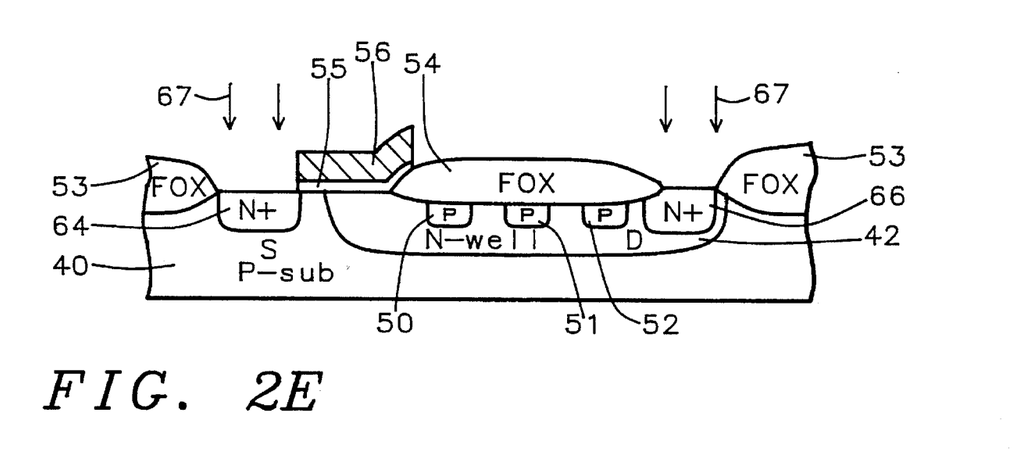
FIG. 2E shows the device of FIG. 2D after the patterning of the gate and removal of the mask using the gate, followed by a self-aligned ion implantation of N+ doped source region located to the left of the N-well in the P-sub forming a source region and a drain region followed by implanting dopant composed of phosphorus ions through the exposed surface of the substrate into N+ regions.

FIG. 2E shows the device of FIG. 2D after the patterning of the gate 56 and removal of the mask 57. Then using the gate 56 and FOX regions 53 and 54, the next step is a self-aligned ion implantation of N+ doped source region 64 and drain region 66. The source region 64 is located between the gate electrode 56 and FOX region 53 to the left of the N-well 42 in the P-sub 40 which is performed forming the source region 64 and the N+ drain region 66 is formed in well 42 between field oxide regions 53 and 54. Dopant 67 composed of phosphorus ions is implanted through exposed surface of the substrate 40 into N+ regions 64 and 66. The dopant 67 is applied at a preferred dose of 5E15 cm$^{-2}$ of P (phosphorus) at a preferred energy of 25 keV to provide a far higher level of doping than in the remainder of P-sub 40 and N-well 42 respectively. A range of energies from about 20 keV to about 30 keV is possible. A range of doses from about 1E15 cm$^{-2}$ to about 5E15 cm$^{-2}$ is possible.

Bridging the source region 64 and the N-well 42 above gate oxide is gate electrode 56.

Figure 2F:
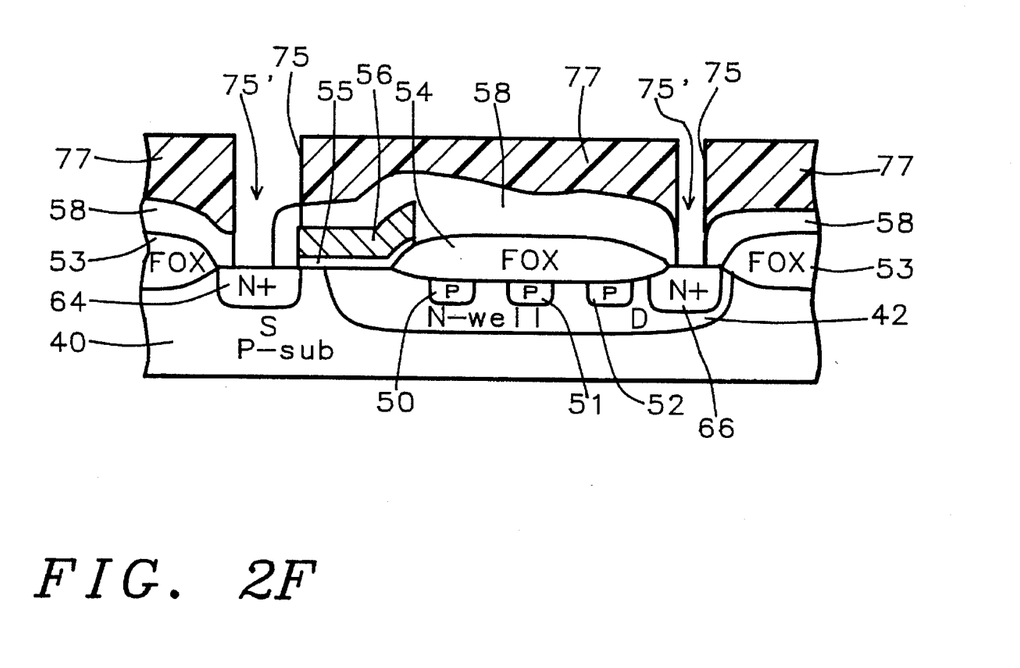
FIG. 2F shows the device of FIG. 2E after the deposition of a dielectric layer, covered with a mask with openings therein through which aligned openings have been formed by etching a dielectric layer through openings to form corresponding openings down to the substrate and N-well on the left and the right respectively between FOX regions over the substrate and over the N-well.

FIG. 2F shows the device of FIG. 2E after the deposition of a dielectric layer 58 composed of a material such as BPSG, covered with a mask 77 with openings 75 therein through which aligned openings 77' have been formed by etching dielectric layer 58 through openings 77' to form corresponding openings 75' therein down to substrate 40 and N-well 42 on the left and the right respectively between FOX regions 53 over the substrate and 54 over the N-well 42.

Figure 2G:
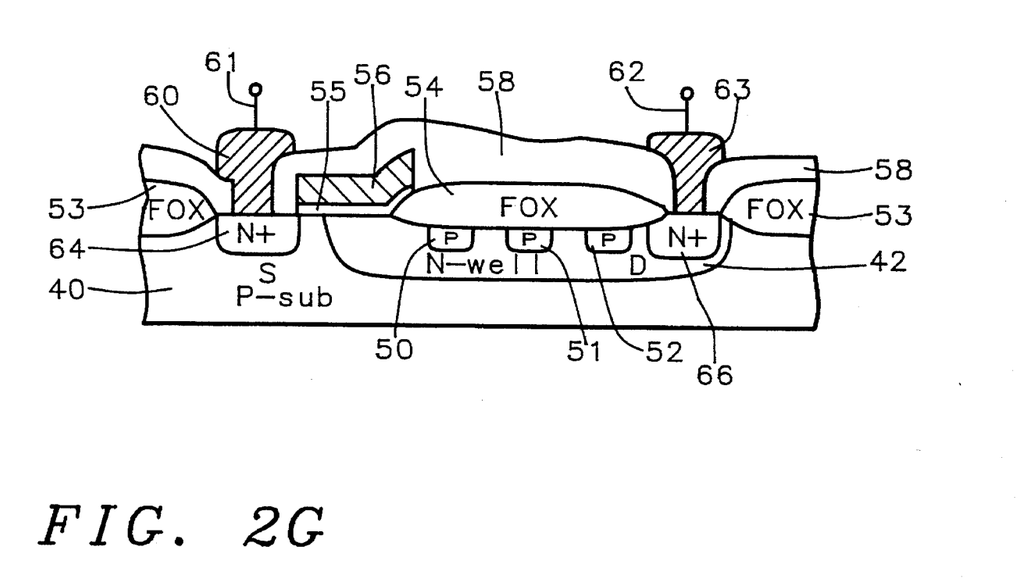
FIG. 2G shows the device of FIG. 2F after the metallization for contacts is deposited in openings in contact with the source and the drain by use of a conventional metallization process with the contact extending over the surface of the dielectric layer.

FIG. 2G shows the device of FIG. 2F after the metallization for contacts 60 and 62 is deposited in openings 75' in contact with the source 64 and the drain 66 by use of a conventional metallization process with the contact extending over the surface of the dielectric layer 58 with a mushroom shaped cross section. A terminal 61 is formed on contact 60 and terminal 63 is formed on contact 62. Thus, source region 64 is connected to terminal 61 through contact electrode 60, and above the N+ drain region 66 to the right of the islands 50, 51 and 52, electrode 62 is connected to terminal 63. When a high voltage is applied to the drain terminal 63, a large degree of depletion will be formed among the islands 50, 51 and 52 and the N-well 42.

Process of Manufacture of Peripheral Device to Power MOSFET with Counter-Doped Islands

Implant N-well and drive in Implanted Ions

Figure 3A:
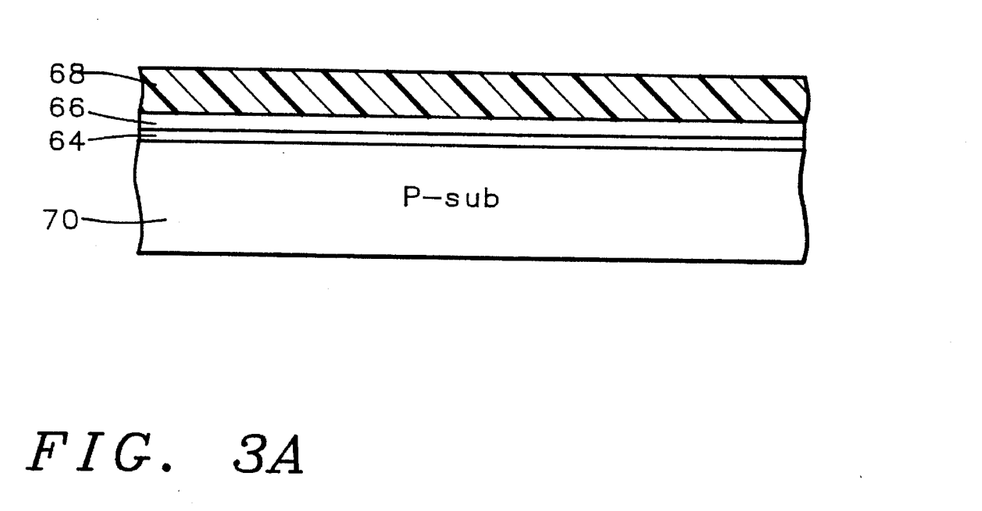
FIG. 3A shows a P doped silicon substrate covered with a thin film gate oxide layer, a silicon nitride ($Si_3N_4$) layer and a photoresist layer for formation of an N-well.

Referring to FIG. 3A, a P doped silicon substrate 70 a thin film gate oxide layer 64, a silicon nitride (Si$_3$N$_4$) layer 66 and photoresist layer 68 have been formed. Photoresist layer 68 was photolithographically exposed, patterned and developed and the Si$_3$N$_4$ layer 36 and the photoresist layer 38 which is newly formed after N-well formation in other areas of the device since in a CMOS device the N-wells are needed for the P-MOSFET. Photoresist layer 68 is stripped and then silicon nitride (Si$_3$N$_4$) 66 and thin film gate oxide layer 64 are removed by conventional techniques.

Field Implant for Peripheral N-MOS Devices

Figure 3B:
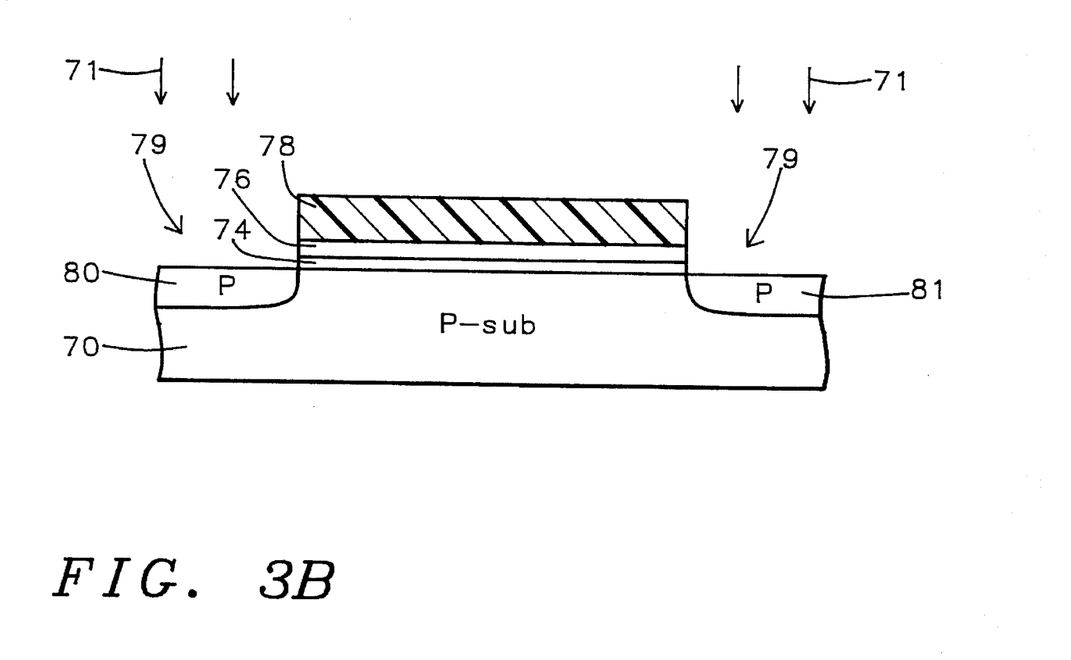
FIG. 3B shows the device of FIG. 3A after a thin film gate oxide layer, a silicon nitride layer and a photoresist layer have been formed for the formation of islands in the N-well.

Referring to FIG. 3B, a thin film gate oxide layer 74, a silicon nitride (Si$_3$N$_4$) layer 76 and a photoresist layer 78 have been formed. The photoresist layer 48 was photolithographically exposed, patterned and developed and the Si$_3$N$_4$ layer 46 and the photoresist layer 48 have been etched to form openings 79. Then, P doped regions for islands 80 and 81 are formed by implanting dopant 71 into openings 79.

Preferably, the islands 80, 81 are of a depth of 3,000 Å. The depth is within a range from about 3,000 Å to about 5,000 Å.

Dopant composed of BF$_2$ ions 71 are implanted through the openings 79 into zones 80 and 81 of P-sub 70. The dopant ions 71 are applied at a preferred dose of 1E12 cm$^{-2}$ of BF$_2$ at a preferred energy of 40 keV to provide a far higher level of doping than in the remainder of the P-sub 70. A range of energies from about 30 keV to about 50 keV is possible. A range of doses from about 1E13 cm$^{-2}$ to about 1E13 cm$^{-2}$ is possible.

Grow Field Oxide and Drive in P- Island

Figure 3C:
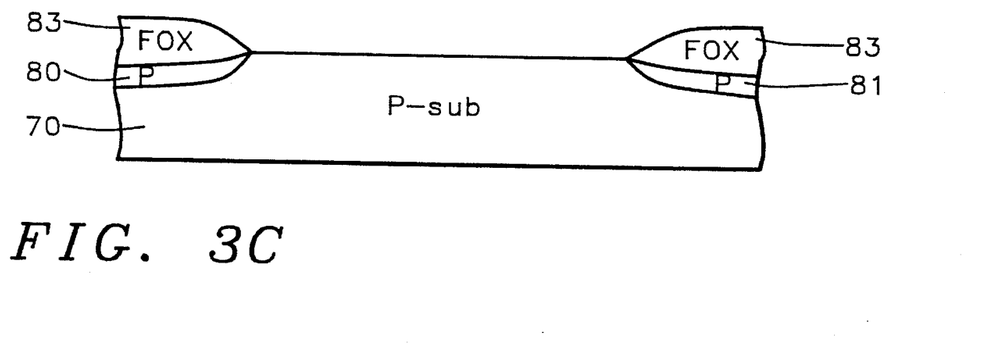
FIG. 3C shows the device of FIG. 3B after FOX regions are formed over the P islands.

Referring to FIG. 3C, FOX regions 83 are formed by a conventional field oxide process over the P doped regions 80 and 81.

Grow Gate Oxide and Deposit Polysilicon

Figure 3D:
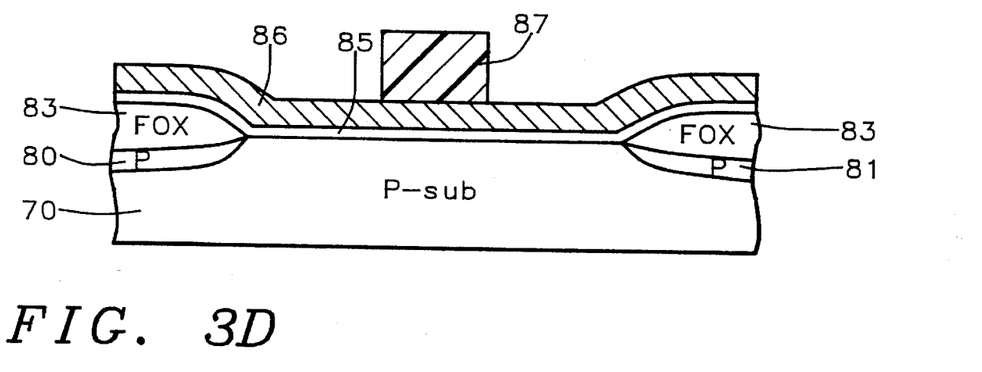
FIG. 3D shows the device of FIG. 3C after a new gate oxide layer is formed on top of the P-sub and the N-well where the FOX regions are absent, and a polysilicon layer deposited upon the gate oxide layer, upon which is deposited a photoresist mask for patterning the polysilicon gate which gate is formed by etching using the mask to protect the gate, and the portions of the gate oxide layer not covered by the gate are etched away.

FIG. 3D shows a new gate oxide layer 85 formed on top of the P-sub 70 and the FOX regions 83. Polysilicon layer 86 is deposited upon the gate oxide layer 85.

Pattern Polysilicon Gate

Then a photoresist mask 87 is formed over the layer 86 and patterned photolithographically to cover the area where the gate 86 is to be formed. Then using the mask 87, the polysilicon layer 86 remaining exposed is etched away leaving the gate 86 as seen in FIG. 3E, and the remainder of the gate oxide layer 85 is also etched away also aside from beneath the gate 86.

Perform Source/Drain Self-Aligned Implant

Figure 3E:
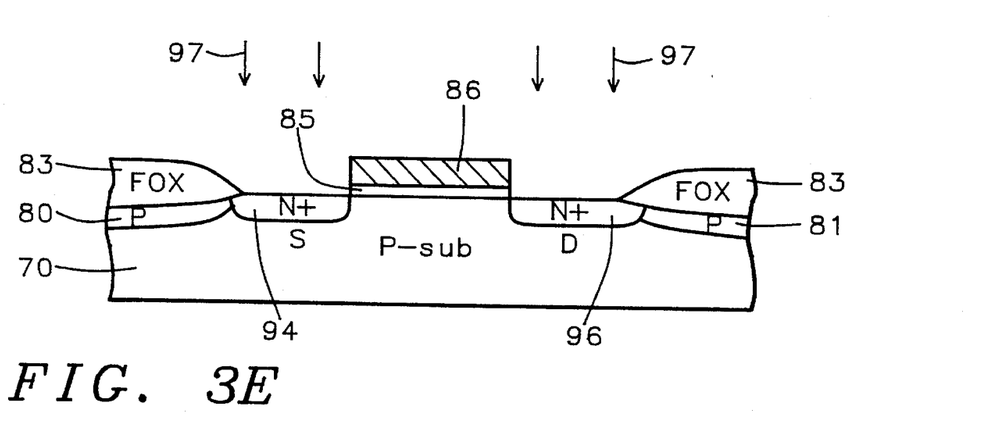
FIG. 3E shows the device of FIG. 3D after the patterning of the gate and removal of the mask using the gate, followed by a self-aligned ion implantation of N+ doped source region located in the P-sub forming a source region and a drain region followed by implanting dopant composed of phosphorus ions through the exposed surface of the substrate forming N+ regions.

FIG. 3E also shows an N+ doped source region 94 located on the left and an N+ doped drain region 96 located on the right. Dopant composed of phosphorus ions 97 are implanted in a self-aligned implant (as in FIG. 2E) between FOX regions 83 and the gate 86. The dopant 97 is applied at a preferred dose of 5E15 cm$^{12}$ of phosphorus at a preferred energy of 30 keV to provide a far higher level of doping than in the remainder of P-sub 70. A range of energies from about 25 keV to about 35 keV is possible. A range of doses from about 1E15 cm$^{-2}$ to about 5E15 cm$^{-2}$ is possible.

Figure 3F:
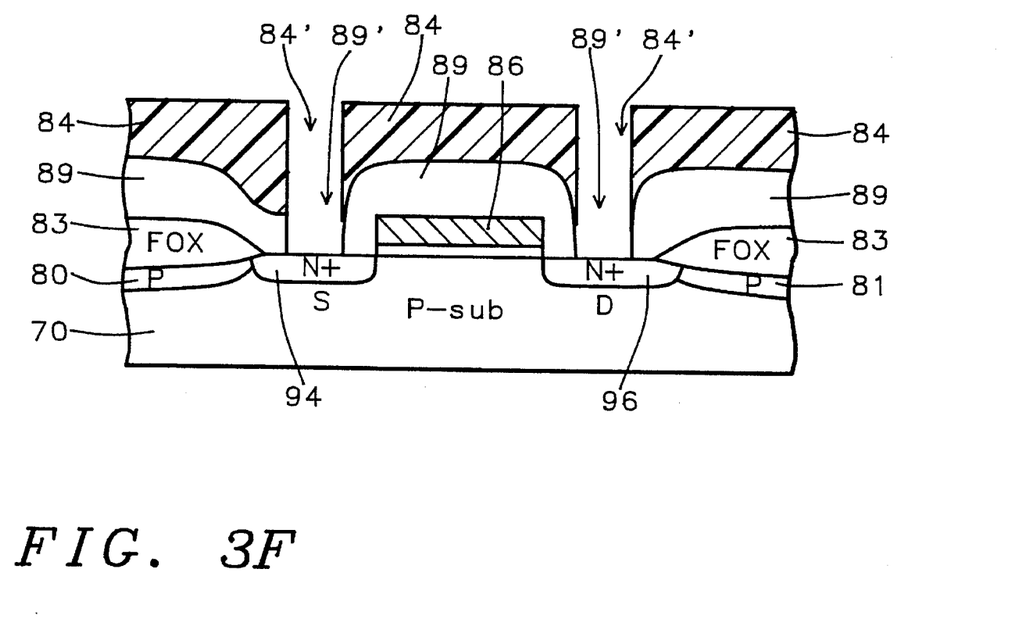
FIG. 3F shows the device of FIG. 3E after the deposition of a dielectric layer, covered with a mask with openings therein through which aligned openings have been formed by etching a dielectric layer through openings to form corresponding openings down to the N+ regions.

FIG. 3F shows the device of FIG. 3E after the deposition of a dielectric layer 89 composed of a material such as BPSG, covered with a mask 84 with openings 84' therein through which aligned openings 84' have been formed by etching dielectric layer 89 through openings 84' to form corresponding openings 89' therein down to source region 94 N-well on the left and drain region 96 on the right respectively.

Figure 3G:
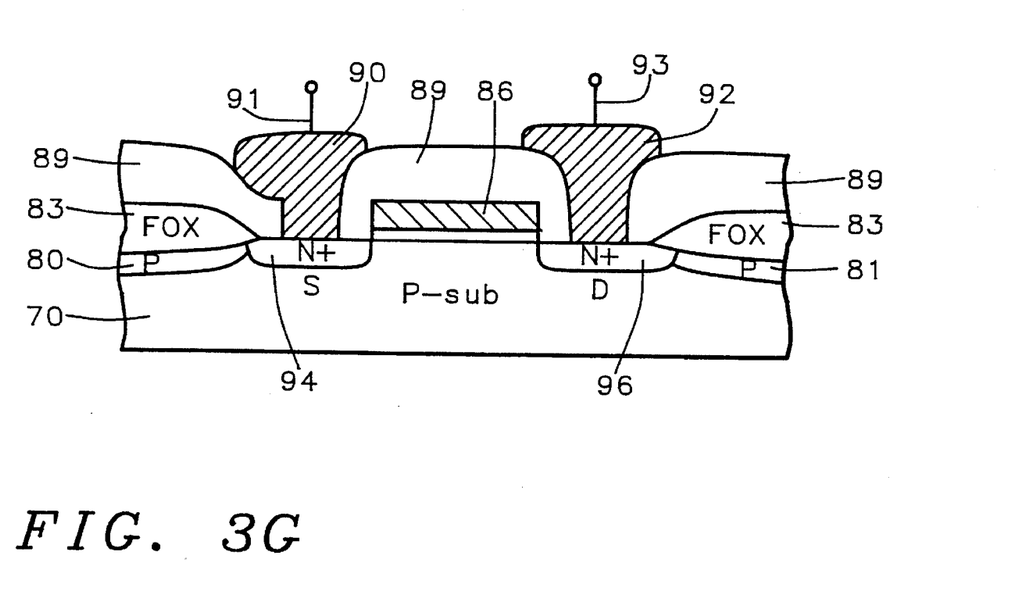
FIG. 3G shows the device of FIG. 3F after the metallization for contacts is deposited in openings in contact with the source and the drain by use of a conventional metallization process with the contact extending over the surface of the dielectric layer.

FIG. 3G shows the device of FIG. 3F after the mask 84 has been removed and after metallization for contacts 90 and 92 is deposited in openings 89' in contact with the source 94 and the drain 96 by use of a conventional metallization process with the contact extending over the surface of the dielectric layer 89 with a mushroom shaped cross section. A terminal 91 is formed on contact 90 and terminal 93 is formed on contact 92. Thus, source region 94 is connected to terminal 91 through contact electrode 90, and above the N+ drain region 96 to electrode 92 is connected to terminal 93.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a metal oxide semiconductor field effect transistor device with a lightly doped P- silicon substrate including an oppositely lightly doped N-well and an N+ doped source region and an N+ doped drain region with respect to said lightly doped P- substrate, the improvement comprising implanting P dopant into a plurality of doped island regions in said N-well formed along the surface of said well between the ultimate locations of said source and drain regions, and forming a field oxide region over said doped island regions, said field oxide region having a first end and a second end, forming a gate electrode over a gate oxide layer on said substrate between said ultimate location of said source region and over said first end of said field oxide region over said doped island regions, performing a self-aligned source/drain ion implant process forming said source region in said substrate adjacent to said gate electrode, and forming said drain region in said N-well adjacent to said second end of said field oxide region.

2. A method of manufacture of a metal oxide semiconductor field effect transistor device with a lightly doped P-doped silicon substrate including an N-doped well, a N+ doped source region and a N+ doped drain region with respect to said lightly doped substrate, comprising the steps performed in the sequence as follows:

implanting P dopant forming doped island regions along the surface of said well between said N+ doped source and drain regions, wherein said well comprises an N- well and forming said island regions by ion implanting with P type dopant, said island regions comprising a plurality of islands between said source region and said drain region, forming a field oxide region over said doped island regions, forming a gate electrode over one end of said field oxide region and said substrate, and ion implanting an N+ source region in said substrate adjacent to said gate electrode and an N+ drain region adjacent to said field oxide region in said well.

3. A method in accordance with claim 2 wherein the depth of said island regions is within a range from about 3,000 Å to about 5,000 Å, the dopant in said island regions is applied at a range of energies from about 30 keV to about 50 keV, and a range of doses from about 1E12 cm$^{-2}$ to about 1E13 cm$^{-2}$.

4. A method in accordance with claim 2 wherein said island regions have a depth of from about 3,000 Å to about 5,000 Å, the dopant in said counter doped region being applied at an energy of about 40 keV with a dose of about 5E12 cm$^{-2}$ of BF$_2$ to provide a far higher level of doping than in the remainder of said N-well.

5. A method in accordance with claim 2 wherein said island regions have a depth of about 3,000 Å, the dopant in said island regions being applied at an energy of about 40 keV with a dose of about 5E12 cm$^{-2}$ of BF$_2$ to provide a far higher level of doping than in the remainder of said N-well.

6. A method of manufacture of a metal oxide semiconductor field effect transistor device with a lightly doped P-silicon substrate including a lightly doped N-well and an N+ doped source region in said P- substrate and an N+ doped drain region in said N- well, said method comprising the steps in the sequence as follows:

forming a first gate oxide layer over said lightly doped P-substrate, forming a first silicon nitride layer over said gate oxide layer, forming a first mask over said silicon nitride layer with an opening for said N-well, ion implanting through said opening in said first mask to form said N-well in said P- silicon substrate with ion implanted dopant, said N-well having a surface exposed through said opening in said first mask, removing said first mask and said first silicon nitride layer and said first gate oxide layer from said substrate, forming a second gate oxide layer on said substrate including said surface of said N-well and forming a second silicon nitride layer on said second gate oxide layer, forming an island implant mask over said second silicon nitride layer with a plurality of openings therein over said N-well, ion implanting P dopant through said openings in said mask to form a plurality of P doped island regions in said N-well along said surface of said N-well, forming a first field oxide region over a portion of said top surface N-well including said P doped island regions and additional field oxide regions over said substrate, forming a gate oxide layer and a gate electrode bridging between said P- substrate and a first end of said first field oxide region, and forming a self-aligned implant to form source/drain N+ regions with said source N+ region formed adjacent to said gate electrode in said P- substrate, and an N+ region adjacent to said first field oxide region in said N-well.

7. A method in accordance with claim 6 wherein the depth of said island regions is within a range from about 3,000 Å to about 5,000 Å, the dopant in said island regions is applied at a range of energies from about 30 keV to about 50 keV, and a dose between about 1E12 cm$^{-2}$ and about 1E13 cm$^{-2}$.

8. A method in accordance with claim 6 wherein said island regions have a depth of about 3,000 Å, the dopant in said island regions being applied at an energy of about 40 keV with a dose of about 5E12 cm$^{-2}$ of BF$_2$ to provide a far higher level of doping than in the remainder of said N-well.

* * * * *